(12) United States Patent
Kim

(10) Patent No.: US 8,258,525 B2
(45) Date of Patent: Sep. 4, 2012

(54) LIGHT EMITTING DEVICE

(75) Inventor: Tae Yun Kim, Gwangju-si (KR)

(73) Assignee: LG Innotek Co., Ltd., Seoul (KR)

( * ) Notice: Subject to any disclaimer, the term of this patent is extended or adjusted under 35 U.S.C. 154(b) by 0 days.

(21) Appl. No.: 13/046,520

(22) Filed: Mar. 11, 2011

(65) Prior Publication Data
US 2011/0163324 A1 Jul. 7, 2011

Related U.S. Application Data

(63) Continuation of application No. 12/107,256, filed on Apr. 22, 2008, now Pat. No. 7,928,454.

(30) Foreign Application Priority Data

Apr. 23, 2007 (KR) .................. 10-2007-0039534

(51) Int. Cl.
*H01L 33/00* (2010.01)

(52) U.S. Cl. .................. 257/97; 257/E33.034
(58) Field of Classification Search .......... 257/97, 257/94, E33.034
See application file for complete search history.

(56) References Cited

U.S. PATENT DOCUMENTS

| | | | |
|---|---|---|---|
| 6,121,638 A | 9/2000 | Rennie et al. | |
| 6,875,627 B2 | 4/2005 | Bour et al. | |
| 7,067,838 B1 * | 6/2006 | Sato et al. | 257/17 |
| 7,501,299 B2 | 3/2009 | Wong et al. | |
| 7,663,138 B2 | 2/2010 | Fujikura | |
| 2007/0152207 A1 | 7/2007 | Yen et al. | |
| 2007/0152232 A1 | 7/2007 | Kobayakawa et al. | |
| 2008/0048172 A1 | 2/2008 | Muraki et al. | |
| 2008/0142781 A1 | 6/2008 | Lee | |
| 2009/0242874 A1 | 10/2009 | Biwa et al. | |

* cited by examiner

*Primary Examiner* — William D Coleman
(74) *Attorney, Agent, or Firm* — Birch, Stewart, Kolasch & Birch, LLP

(57) ABSTRACT

A light emitting diode of one embodiment includes a light emitting device having a plurality of N-type semiconductor layers including a first N-type semiconductor layer and a second N-type semiconductor layer on the first N-type semiconductor layer, an active layer on an upper layer of the plurality of N-type semiconductor layers, and a P-type semiconductor layer on the active layer. The first N-type semiconductor layer includes a first Si doped Nitride layer and the second N-type semiconductor layer includes a second Si doped Nitride layer. The first and second N-type semiconductor layers have a Si impurity concentration different from each other.

20 Claims, 1 Drawing Sheet

LIGHT EMITTING DEVICE

CROSS REFERENCE TO RELATED APPLICATIONS

This application is a continuation of application Ser. No. 12/107,256, filed on Apr. 22, 2008, now U.S. Pat. No. 7,928,454 that claims priority under 35 U.S.C. §119 to Korean Patent Application No. 10-2007-0039534, filed on Apr. 23, 2007, the entire contents of which are hereby incorporated by reference and for which priority is claimed under 35 U.S.C. §120.

BACKGROUND OF THE INVENTION

1. Field of the Invention

The embodiment relates to a light emitting diode and a method for manufacturing the same.

2. Discussion of the Related Art

A light emitting diode is formed by sequentially stacking a buffer layer, an unintentionally doped GaN layer (Un-GaN layer), an N-type GaN layer, an active layer, and a P-type GaN layer on a substrate.

The light emitting diode has a characteristic in which electrons are inserted into holes on the active layer to emit light if power is applied to the N-type GaN layer and the P-type GaN layer.

Meanwhile, since the substrate has a lattice constant different from that of the N-type GaN layer, dislocation may occur, and the buffer layer and the Un-GaN layer reduce a difference between lattice constants of the substrate and the GaN layer.

However, the buffer layer and the Un-GaN layer have a limitation in the reduction of the difference of the lattice constants, and the dislocation density may be increased due to the Un-GaN layer.

SUMMARY OF THE INVENTION

The embodiment provides a light emitting device and a method for manufacturing the same.

The embodiment provides a light emitting device and a method for manufacturing the same, capable of reducing dislocation density.

The embodiment provides a light emitting device and a method for manufacturing the same, capable of reducing lattice mismatching, thereby improving a light emitting characteristic.

According to the embodiment, a light emitting device comprises a plurality of N-type semiconductor layers including a first N-type semiconductor layer and a second N-type semiconductor layer on the first N-type semiconductor layer; an active layer on an upper layer of the plurality of N-type semiconductor layers; and a P-type semiconductor layer on the active layer, wherein the first N-type semiconductor layer comprises a Si doped Nitride layer and the second N-type semiconductor layer comprises a Si doped Nitride layer, and wherein the first and second N-type semiconductor layers have a Si impurity concentration different from each other.

According to the embodiment, a light emitting device comprises a plurality of N-type semiconductor layers including a first N-type semiconductor layer and a second N-type semiconductor layer on the first N-type semiconductor layer; an active layer on a first portion of an upper layer of the plurality of N-type semiconductor layers; a P-type semiconductor layer on the active layer, a first electrode on a second portion of the upper layer of the plurality of N-type semiconductor layers; and a second electrode on the P-type semiconductor layer, wherein the first N-type semiconductor layer comprises a Si doped Nitride layer and the second N-type semiconductor layer comprises a Si doped Nitride layer, and wherein the first and second N-type semiconductor layers have a Si impurity concentration different from each other.

According to the embodiment, a light emitting device comprises a sapphire substrate; a first N-type semiconductor layer including a GaN layer on the sapphire substrate; a second N-type semiconductor layer including a GaN layer on the first N-type semiconductor layer; an undoped GaN layer on the second N-type semiconductor layer; an active layer on the undoped GaN layer; and a P-type GaN layer on the active layer, wherein the first and second N-type semiconductor layers have a Si impurity concentration different from each other.

DETAILED DESCRIPTION OF THE PREFERRED EMBODIMENTS

Figure 1:
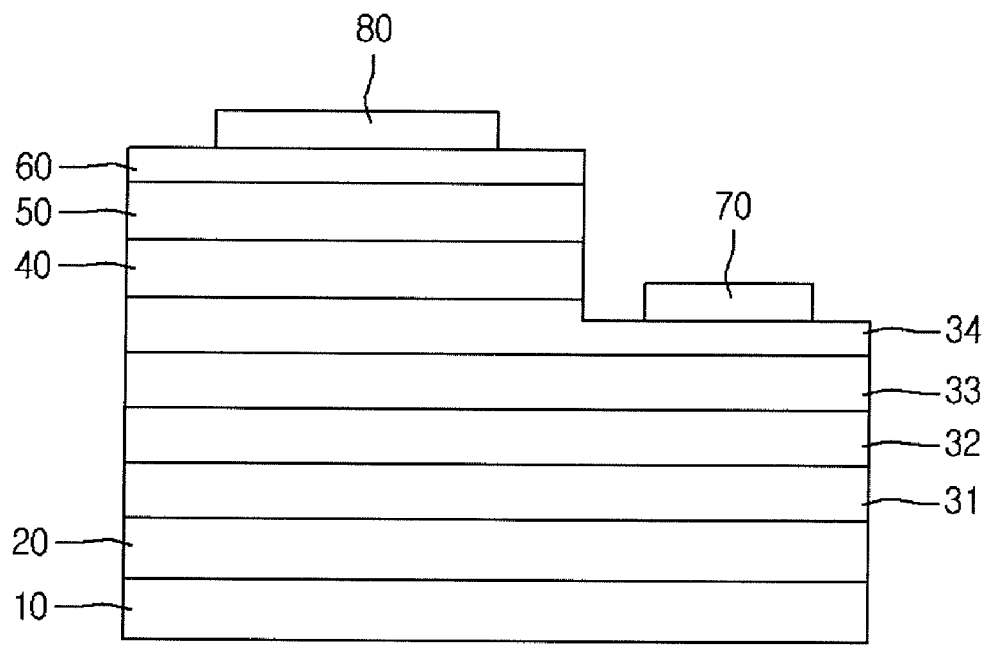
FIG. 1 is a view used to explain a light emitting diode according to the first embodiment.

In the description of the embodiments, when layers (films), regions, patterns, or elements are described in that they are formed on or under substrates, layers (films), regions, or patterns, it means that they are formed directly or indirectly on or under the substrates, layers (films), regions, or patterns.

The thickness and size of each layer shown in the drawings can be simplified or exaggerated for the purpose of convenience or clarity. In addition, the elements may have sizes different from those shown in drawings in practice.

Hereinafter, a light emitting diode and a method for manufacturing the same with reference to accompanying drawings.

FIG. 1 is a view used to explain a light emitting diode according to a first embodiment.

The light emitting diode according to the first embodiment comprises a substrate 10, a buffer layer 20, a first Un-GaN layer 31, a first N-type GaN layer 32, a second Un-GaN layer 33, a second N-type GaN layer 34, an active layer 40, a P-type GaN layer 50, and an ohmic electrode layer 60. A first electrode layer 70 is formed on the second N-type GaN layer 34, and a second electrode layer 80 is formed on the ohmic electrode layer 60.

As shown in FIG. 1, the light emitting diode according to the first embodiment includes the first and second Un-GaN layers 31 and 33 and the first and second N-type GaN layers 32 and 34, which are alternatively and repeatedly stacked on the buffer layer 20.

As shown in FIG. 1, the Un-GaN layer and the N-type GaN layer are repeated twice.

According to the first embodiment, the first N-type GaN layer 32 is formed between the first and second Un-GaN layers 31 and 33, thereby preventing the occurrence of a dislocation density due to the first and second Un-GaN layers 31 and 33. According to the first embodiment, a plurality of Un-GaN layers are provided, in which each Un-GaN layer is thinner than an Un-GaN layer provided in a single layer structure of the Un-GaN layer and an N-type GaN layer according to the related art. Similarly, each N-type GaN layer may be thin a conventional N-type GaN layer.

In other words, the increase of dislocation density occurring as the Un-GaN layer becomes thick is prevented by forming a plurality of thin Un-GaN layers.

For example, the first and second Un-GaN layer 31 and 33 may have thicknesses in the range of 0.5 μm to 1 μm, and the first and second N-type GaN layers 32 and 34 may have thicknesses in the range of 1 μm to 1.5 μm.

According to the first embodiment, the dislocation density of the first and second N-type GaN layers 32 and 34 is reduced as the N-type GaN layers become close to the active layer 40, that is, distant from the buffer layer 20.

To this end, the first and second Un-GaN layers 31 and 33 and the first and second N-type GaN layers 32 and 34 are formed in a chamber having a higher temperature and a lower pressure while reducing the amount of TMGa flowed into the chamber as the Un-GaN layers and the N-type GaN layers are close to the active layer 40.

Further, since a dislocation density may be increased as the concentration of impurities is increased in the first and second N-type GaN layers 32 and 34, the concentration of N-type impurities is decreased as the N-type GaN layers become close to the active layer 40.

Figure 2:
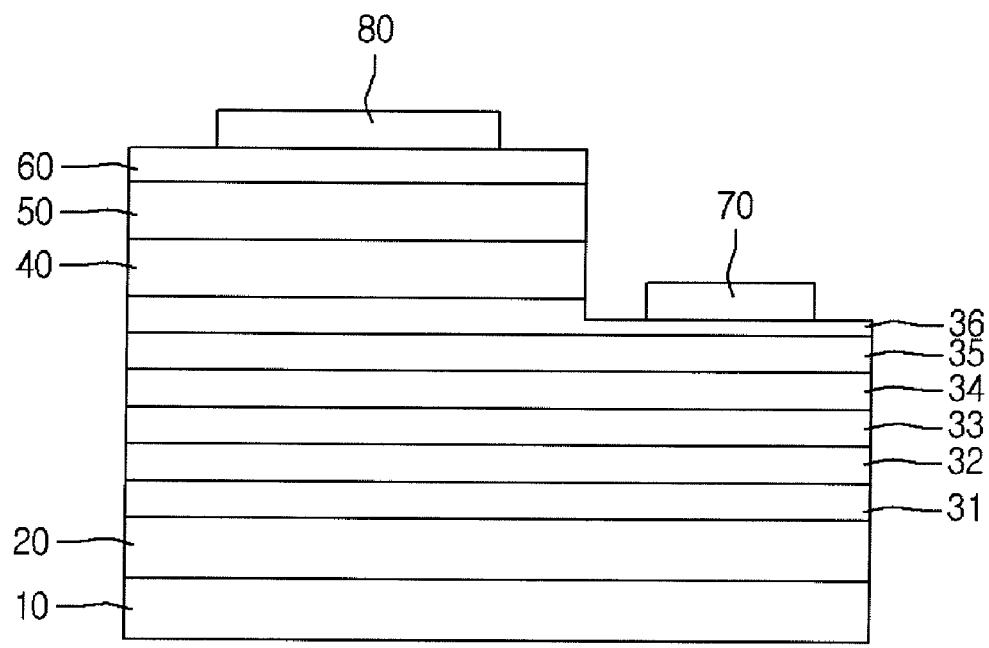
FIG. 2 is a view used to explain a light emitting diode according to the second embodiment.

FIG. 2 is a view used to explain a light emitting diode according to a second embodiment.

The light emitting diode according to the second embodiment comprises a substrate 10, a buffer layer 20, a first Un-GaN layer 31, a first N-type GaN layer 32, a second Un-GaN layer 33, a second N-type GaN layer 34, a third Un-GaN layer 35, a third N-type GaN layer 36, an active layer 40, a P-type GaN layer 50, and an ohmic electrode layer 60. A first electrode layer 70 is formed on the third N-type GaN layer 36, and a second electrode layer 80 is formed on the ohmic electrode layer 60.

As shown in FIG. 2, the light emitting diode according to the second embodiment has the first, second, and third Un-Ga layers 31, 33, and 35 and the first, second, and third N-type GaN layers 32, 34, and 36 alternatively stacked on the buffer layer 20.

As shown in FIG. 2, the Un-GaN layers and the N-type GaN layers are repeated three times.

Although it is not shown, the Un-GaN layers and the N-type GaN layers may be repeated four times according to another embodiment.

According to the second embodiment, the first and second N-type GaN layers 32 and 34 are alternately provided in relation to the first, second, and third Un-GaN layers 31, 33, and 35, thereby preventing the increase of dislocation density by the first, second, and third Un-GaN layers 31, 33, and 35. According to the second embodiment, a plurality of Un-GaN layers are provided. In this case, the first, second, and third Un-GaN layers 31, 33, and 35 are thinner than an Un-GaN layer provided in a single layer structure of the Un-GaN layer and an N-type GaN layer according to the related art. Similarly, the first, second, and third N-type GaN layers 32, 34, and 36 may be thin a conventional N-type GaN layer.

In other words, the increase of dislocation density occurring as the Un-GaN layer becomes thick is prevented by forming a plurality of thin Un-GaN layers.

For example, the first, second, and third Un-GaN layers 31, 33, and 35 may have thicknesses in the range of 0.3 μm on to 0.6 μm, and the first, second, and third N-type GaN layers 32, 34, and 36 may have thicknesses in the range of 0.5 μm to 1 μm.

According to the second embodiment, the dislocation density of the N-type GaN layer is reduced as the N-type GaN layer becomes close to the active layer 40, that is, distant from the buffer layer 20.

To this end, the Un-GaN layer and the N-type GaN layer are formed in a chamber having a higher temperature and a lower pressure while reducing an amount of TMGa flowed into the chamber as the Un-GaN layer and the N-type GaN layer are close to the active layer 40.

Further, since a dislocation density may be increased as the concentration of impurities is increased in the first, second, and third N-type GaN layers 32, 34, and 36, the concentration of N-type impurities is decreased as the N-type GaN layers become close to the active layer 40.

As described above, in the light emitting diode according to the embodiments, a plurality of thin Un-GaN layers are provided, and the N-type GaN layers are provided between the Un-GaN layers in order to prevent the increase of dislocation density caused by the Un-GaN layers. Accordingly, the increase of the dislocation density in the Un-GaN layer can be prevented due to the N-type GaN layer.

In addition, the light emitting diode according to the embodiments is provided such that dislocation density is decreased as the N-type GaN layer becomes close to the active layer 40.

Accordingly, the dislocation density of the N-type GaN layer in contact with the active layer 40 is decreased so that the light emitting characteristic of the light emitting diode can be improved.

Hereinafter, a method for manufacturing the light emitting diode according to the embodiment will be described in detail with reference to FIG. 2.

The buffer layer 20 is formed on the substrate 10. For example, the substrate 10 includes at least one of $Al_2O_3$, Si, SiC, GaAs, ZnO, and MgO.

The buffer layer 20 is used to reduce a difference between lattice constants of the substrate 10 and the GaN layer stacked on the substrate 10. For example, the buffer layer 20 may have a stacking structure such as AlInN/GaN, $In_xGa_{1-x}$N/GaN, or $Al_xIn_yGa_{1-x-y}$N/$In_xGa_{1-x}$N/GaN.

For example, the buffer layer 20 may be grown by flowing TMGa and TMIn at a flow rate of $3 \times 10^5$ Mol/min into the chamber, in which the substrate 10 is positioned, and flowing TMAl at a flow rate of $3 \times 10^6$ Mol/min into the chamber together with hydrogen gas and ammonia gases.

The first Un-GaN layer 31, the first N-type GaN layer 32, the second Un-GaN layer 33, the second N-type GaN layer 34, the third Un-GaN layer 35, the third N-type GaN layer 36 are sequentially formed on the buffer layer 20. The first, second, and third Un-GaN layers 31, 33, and 35 and the first, second, and third N-type GaN layer 32, 34, and 36 may be formed through a metal-organic vapor chemical deposition (MOCVD) process.

First, the first Un-GaN layer 31 is formed on the buffer layer 20. For example, the first Un-GaN layer 31 may be formed by flowing $NH_3$ ($3.7 \times 10^{-2}$ Mol/min) and TMGa ($2.9 \times 10^{-4}$-$3.1 \times 10^{-4}$ Mol/min) gas in a state in which the chamber is adjusted to have internal pressure of 500 Torr to 700 Torr and the internal temperature in the range of 1040☐ to 1050☐.

Then, the first N-type GaN layer 32 is formed on the first Un-GaN layer 31. For example, the first N-type GaN layer 32 is formed by flowing $NH_3$ ($3.7 \times 10^{-2}$ Mol/min), TMGa ($2.9 \times 10^{-4}$-$3.1 \times 10^{-4}$ Mol/min), a $SiH_4$ gas including N-type impurities such as Si in a state in which a chamber is adjusted to have an internal pressure of 500 Torr to 700 Torr and an internal temperature the temperature in the range of 1040☐ to 1050☐.

In this case, the first N-type GaN layer 32 may have a dislocation density of $10^{10}/cm^3$ or less. In addition, Si may be implanted into the first N-type GaN layer 32 with the concentration of $7 \times 10^{18}/cm^3$.

The second Un-GaN layer 33 is formed on the first N-type GaN layer 32. The second Un-GaN layer 33 is formed by flowing a less amount of TMGa gas in a chamber with a lower pressure under a higher temperature as compared with the process of performing the first Un-GaN layer 31.

For example, the second Un-GaN layer 33 may be formed by flowing $NH_3$ ($3.7 \times 10^{-2}$ Mol/min) and TMGa ($1.9 \times 10^{-4}$-$2.1 \times 10^{-4}$ Mol/min) gas in a state in which a chamber is adjusted to have an internal pressure of 300 Torr to 500 Torr and an internal temperature in the range of 1050° C. to 1060° C.

The second N-type GaN layer 34 is formed on the second Un-GaN layer 33. The second N-type GaN layer 34 is formed by flowing a less amount of a TMGa gas and an $SiH_4$ gas in a chamber with a lower pressure under a higher temperature as compared with the process of performing the first N-type GaN layer 32.

For example, the second N-type GaN layer 34 may be formed by flowing $NH_3$ ($3.7 \times 10^{-2}$ Mol/min), TMGa ($1.9 \times 10^{-4}$-$2.1 \times 10^{-4}$ Mol/min), and a $SiH_4$ gas including N-type impurities such as Si in a state in which a chamber is adjusted to have an internal pressure of 300 Torr to 500 Torr and an internal in the range of 1050☐ to 1060☐.

In this case, the second N-type GaN layer 34 may have the dislocation density of $10^9/cm^3$ or less. In addition, Si may be implanted into the second N-type GaN layer 34 with the concentration of $5 \times 10^{18}/cm^3$.

The third Un-GaN layer 35 is formed on the second N-type GaN layer 34. The third Un-GaN layer 35 is formed by flowing a less amount of a TMGa gas in a chamber with a lower pressure under a higher temperature as compared with the process of performing the second Un-GaN layer 33.

For example, the third Un-GaN layer 35 may be formed by flowing $NH_3$ ($3.7 \times 10^{-2}$ Mol/min) and TMGa ($1.4 \times 10^{-4}$-$1.6 \times 10^{-4}$ Mol/min) gas in a state in which a chamber is adjusted to have an internal pressure of 200 Torr to 300 Ton and an internal temperature in the range of 1060° C. to 1070° C.

The third N-type GaN layer 36 is formed on the third Un-GaN layer 35. The third N-type GaN layer 36 is formed by flowing a less amount of a TMGa gas and an $SiH_4$ gas in a chamber with a lower pressure under a higher temperature as compared with the process of performing the second N-type GaN layer 34.

For example, the third N-type GaN layer 36 may be formed by flowing $NH_3$ ($3.7 \times 10^{-2}$ Mol/min), TMGa ($1.4 \times 10^{-4}$-$1.6 \times 10^{-4}$ Mol/min), and a $SiH_4$ gas including N-type impurities such as Si in a state in which a chamber is adjusted to have an internal pressure of 200 Torr to 300 Torr and an internal temperature in the range of 1060° C. to 1070° C.

In this case, the third N-type GaN layer 36 may have the dislocation density of $10^8/cm^3$ or less. In addition, Si may be implanted into the third N-type GaN layer 36 with the concentration of $3 \times 10^{18}/cm^3$.

The active layer 40 is formed on the third N-type GaN layer 36. For example, the active layer 40 may have a multi-quantum well structure including InGaN/GaN which is grown at a nitrogen gas atmosphere by flowing TMGa and TMIn into the chamber.

The P-type GaN layer 50 is formed on the active layer 40. For example, the P-type GaN layer 50 may be grown by supplying TMGa ($7 \times 10^{-6}$ Mol/min), TMAl ($2.6 \times 10^{-5}$ Mol/min), (EtCp$_2$Mg){Mg($C_2H_5C_5H_4$)$_2$} ($5.2 \times 10^{-7}$ Mol/min), and $NH_3$ ($2.2 \times 10^{-1}$ Mol/min using hydrogen as a carrier gas.

The ohmic electrode layer 60 is formed on the P-type GaN layer 50. For example, the ohmic electrode layer 60 includes at least one of ITO, CTO, $SnO_2$, ZnO, $RuO_x$, $TiO_x$, $IrO_x$, and $Ga_xO_x$.

After the above stacking structure is formed, a mask layer (not shown) is formed on the ohmic electrode 60. The ohmic electrode layer 60, the P-type GaN layer 50, the active layer 40, and the third N-type GaN layer 36 are selectively etched so that a portion of the third N-type GaN layer 36 is exposed upward.

The first electrode layer 70 is formed on the third N-type GaN layer 36, and the second electrode layer 80 is formed on the ohmic electrode layer 60.

Accordingly, the light emitting diode according to the embodiments can be manufactured.

In the light emitting diode and the method for manufacturing the same according to the embodiments, the Un-GaN layer and the N-type GaN layer are alternatively stacked, thereby reducing the dislocation density on the N-type GaN layer adjacent to the active layer.

Further, in the light emitting diode and the method for manufacturing the same according to the embodiments, a plurality of Un-GaN layers and N-type GaN layers are provided. In this case, the Un-GaN layers and the N-type GaN layers are formed by reducing an amount of TMGa flowed into the chamber while increasing the temperature of a chamber and reducing the pressure of the chamber step by step. Accordingly, the dislocation density of the N-type GaN layer adjacent to the active layer may be more reduced.

In the light emitting diode and the method for manufacturing the same according to the embodiments, a plurality of Un-GaN layers and a plurality of N-type GaN are formed. In this case, the N-type GaN layer is formed by reducing an amount of N-type impurities step by step. Accordingly, the dislocation density of the N-type GaN layer adjacent to the active layer can be more reduced.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:
1. A light emitting device, comprising:
   a plurality of N-type semiconductor layers including a first N-type semiconductor layer and a second N-type semiconductor layer on the first N-type semiconductor layer;
   an active layer on an upper layer of the plurality of N-type semiconductor layers; and
   a P-type semiconductor layer on the active layer, wherein the first N-type semiconductor layer comprises a first Si doped Nitride layer and the second N-type semiconductor layer comprises a second Si doped Nitride layer, and wherein the first and second N-type semiconductor layers have a Si impurity concentration different from each other.

2. The light emitting device according to claim 1, wherein the second N-type semiconductor layer has a Si impurity concentration lower than a Si impurity concentration of the first N-type semiconductor layer.

3. The light emitting device according to claim 1, wherein at least one of the first and second N-type semiconductor layers comprises an N-type GaN layer.

4. The light emitting device according to claim 1, further comprising:
an undoped GaN layer on the second N-type semiconductor layer.

5. The light emitting device according to claim 1, further comprising:
an undoped GaN layer between the second N-type semiconductor layer and the active layer.

6. The light emitting device according to claim 1, wherein the first and second N-type semiconductor layers comprise an N-type GaN layer.

7. The light emitting device according to claim 1, wherein the second N-type semiconductor layer has a dislocation density lower than a dislocation density of the first N-type semiconductor layer.

8. The light emitting device according to claim 1, further comprising:
a first electrode on a first portion of the upper layer of the plurality of N-type semiconductor layer; and
a second electrode on the P-type semiconductor layer.

9. The light emitting device according to claim 8, further comprising:
an ohmic electrode layer between the second electrode layer and the P-type semiconductor layer.

10. A light emitting device, comprising:
a plurality of N-type semiconductor layers including a first N-type semiconductor layer and a second N-type semiconductor layer on the first N-type semiconductor layer;
an active layer on a first portion of an upper layer of the plurality of N-type semiconductor layers;
a P-type semiconductor layer on the active layer;
a first electrode on a second portion of the upper layer of the plurality of N-type semiconductor layers; and
a second electrode on the P-type semiconductor layer,
wherein the first N-type semiconductor layer comprises a first Si doped Nitride layer and the second N-type semiconductor layer comprises a second Si doped Nitride layer, and
wherein the first and second N-type semiconductor layers have a Si impurity concentration different from each other.

11. The light emitting device according to claim 10, wherein the second N-type semiconductor layer has a Si impurity concentration lower than a Si impurity concentration of the first N-type semiconductor layer.

12. The light emitting device according to claim 10, wherein at least one of the first and second N-type semiconductor layers comprises an N-type GaN layer.

13. The light emitting device according to claim 10, further comprising:
an undoped GaN layer on the second N-type semiconductor layer.

14. The light emitting device according to claim 10, further comprising:
an undoped GaN layer between the second N-type semiconductor layer and the active layer.

15. The light emitting device according to claim 10, wherein the first and second N-type semiconductor layers comprise an N-type GaN layer.

16. The light emitting device according to claim 10, wherein the second N-type semiconductor layer has a dislocation density lower than a dislocation density of the first N-type semiconductor layer.

17. The light emitting device according to claim 10, further comprising:
an ohmic electrode layer between the second electrode layer and the P-type semiconductor layer.

18. A light emitting device, comprising:
a sapphire substrate;
a first N-type semiconductor layer including a GaN layer on the sapphire substrate;
a second N-type semiconductor layer including a GaN layer on the first N-type semiconductor layer;
an undoped GaN layer on the second N-type semiconductor layer;
an active layer on the undoped GaN layer; and
a P-type GaN layer on the active layer,
wherein the first and second N-type semiconductor layers have a Si impurity concentration different from each other.

19. The light emitting device according to claim 18, wherein the second N-type semiconductor layer has a Si impurity concentration lower than a Si impurity concentration of the first N-type semiconductor layer.

20. The light emitting device according to claim 18, further comprising:
a first electrode on a first portion of the second N-type semiconductor layer; and
a second electrode on the P-type GaN layer.

* * * * *